United States Patent
Ma et al.

(10) Patent No.: US 9,721,826 B1
(45) Date of Patent: Aug. 1, 2017

(54) WAFER SUPPORTING STRUCTURE, AND DEVICE AND METHOD FOR MANUFACTURING SEMICONDUCTOR

(71) Applicant: TAIWAN SEMICONDUCTOR MANUFACTURING CO., LTD., Hsinchu (TW)

(72) Inventors: Chih-Yu Ma, Taitung County (TW); Yii-Chi Lin, Taipei (TW); Zheng-Yang Pan, Hsinchu County (TW); Chia-Chiung Lo, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 24 days.

(21) Appl. No.: 15/007,041

(22) Filed: Jan. 26, 2016

(51) Int. Cl.
| | | |
|---|---|---|
| *B23P 19/04* | (2006.01) | |
| *H01L 21/687* | (2006.01) | |
| *H01L 21/67* | (2006.01) | |
| *H01L 21/66* | (2006.01) | |
| *H01L 21/324* | (2006.01) | |

(52) U.S. Cl.
CPC ...... *H01L 21/68785* (2013.01); *H01L 21/324* (2013.01); *H01L 21/67115* (2013.01); *H01L 21/67248* (2013.01); *H01L 21/68792* (2013.01); *H01L 22/20* (2013.01)

(58) Field of Classification Search
CPC .... H01L 21/68785; B25B 11/00; B25B 11/02
See application file for complete search history.

(56) References Cited

U.S. PATENT DOCUMENTS

| | | | | |
|---|---|---|---|---|
| 5,445,675 A | * | 8/1995 | Kubodera | C23C 16/48 118/719 |
| 8,888,087 B2 | * | 11/2014 | Okabe | H01L 21/02617 269/289 R |
| 2013/0276695 A1 | * | 10/2013 | Pitney | H01L 21/02104 117/86 |
| 2014/0253873 A1 | * | 9/2014 | Crosby | G02B 3/14 351/159.68 |

* cited by examiner

*Primary Examiner* — Lee D Wilson
(74) *Attorney, Agent, or Firm* — Maschoff Brennan

(57) ABSTRACT

A wafer supporting structure in semiconductor manufacturing, and a device and a method for manufacturing semiconductor are provided. In accordance with some embodiments of the instant disclosure, a wafer supporting structure in semiconductor manufacturing includes a transparent ring and at least two arms. The arms are connected to the transparent ring.

20 Claims, 18 Drawing Sheets

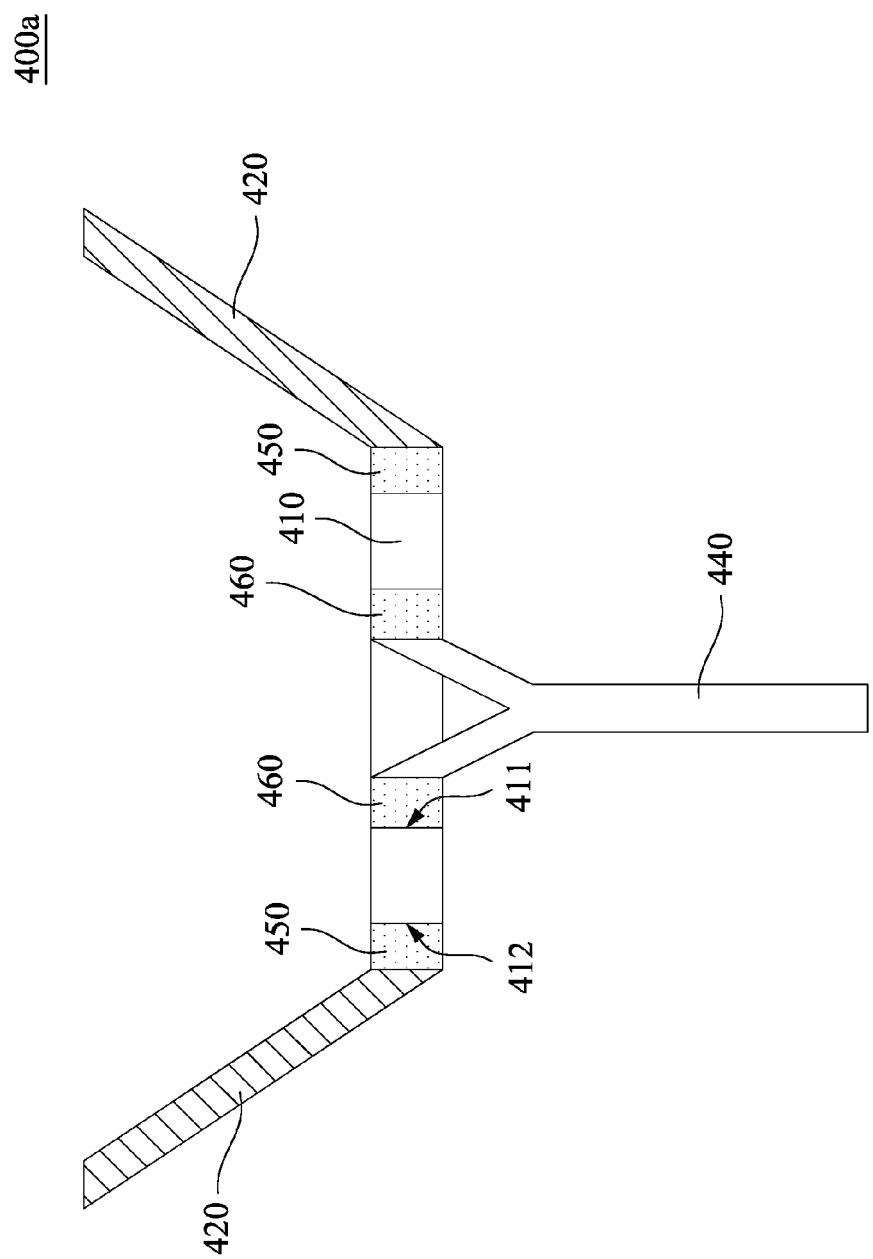

WAFER SUPPORTING STRUCTURE, AND DEVICE AND METHOD FOR MANUFACTURING SEMICONDUCTOR

BACKGROUND

The semiconductor industry has experienced exponential growth. Integrated circuits such as microprocessors, memory and other high density devices have an increasing demand for epitaxially grown silicon wafers. Semiconductor manufacturing require precise control of fabrication process parameters so as to reduce operation and process variations and improve the quality, performance and yield of wafers.

In the manufacturing process of semiconductor, an important step is wafer temperature controlling. A non-uniform temperature distribution on a wafer during the manufacturing process may generate different chemical reaction rates at different portions of the wafer. As a result, the deposition rate difference on the wafer may cause an uneven surface. Such an uneven surface may lead to defects in subsequent fabrication processes, such as a defect in the photolithography process due to the uneven surface of the wafer.

However, the performance of current device for manufacturing semiconductor is still not satisfactory in advanced applications of technology. Accordingly, a device for manufacturing semiconductor has to be continuously improved so as to obtain a more satisfactory semiconductor structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C is a cross-sectional view of a wafer supporting structure according to some embodiments.

DETAILED DESCRIPTION

Figure 1A:
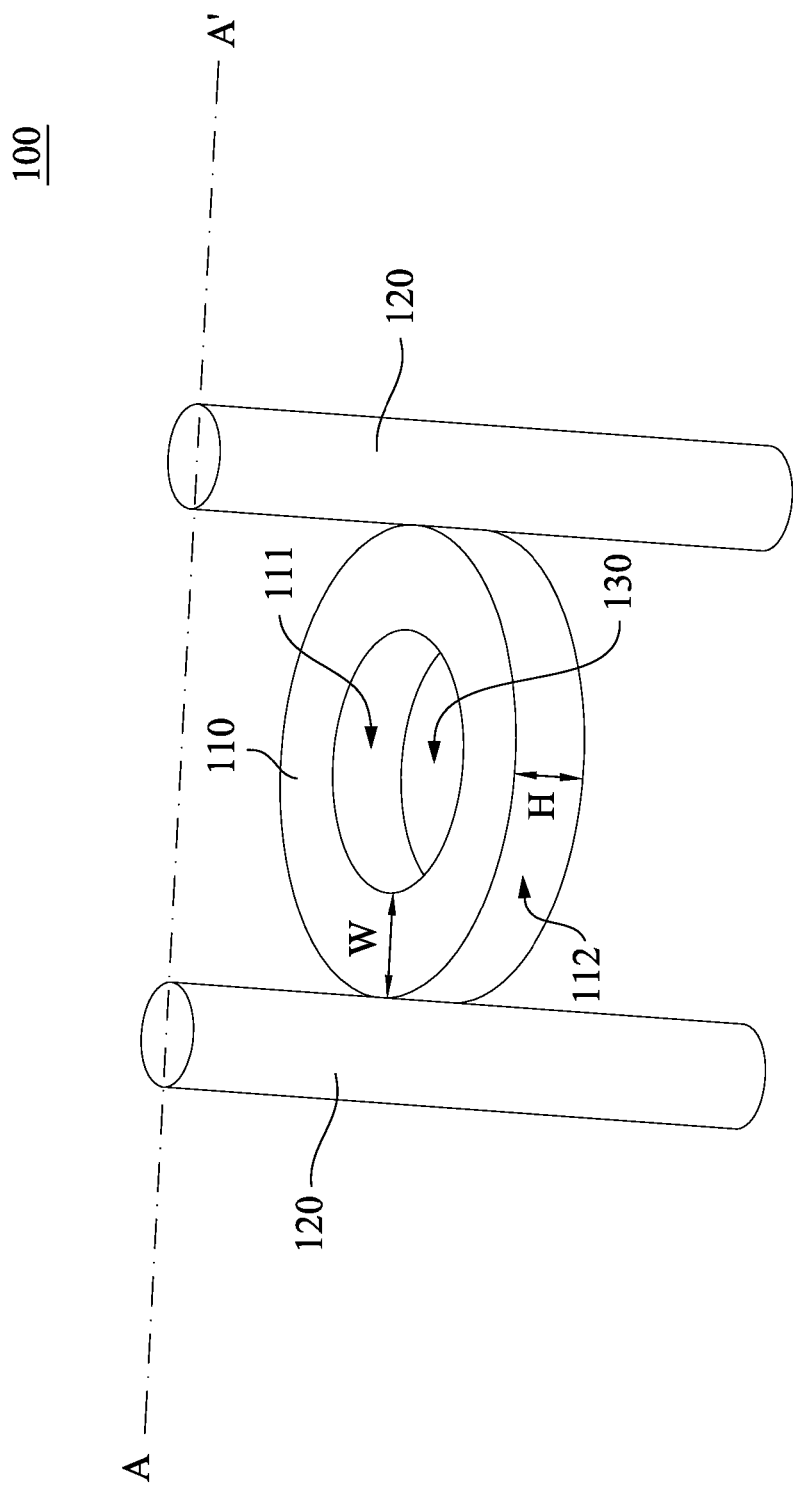
FIG. 1A is a three dimensional view of a wafer supporting structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, the uniformity of the wafer can be improved by precisely controlling the temperature during the manufacturing process, especially for an epitaxial growth process. Particularly, the temperature of the epitaxially grown wafer is important to the uniformity of the wafer when an epitaxial layer is deposited on the wafer. Accordingly, the wafer temperature controlling is important for fabricating a semiconductor structure, especially during an epitaxial growth process. A non-uniform temperature distribution on an epitaxially grown wafer may generate different deposition rates at different portions of the epitaxially grown wafer, and may cause an uneven surface on the epitaxially grown wafer, which may lead to defects in subsequent fabrication processes.

In order to precisely control the temperature of the wafer, the detection of the wafer temperature is a crucial factor for manufacturing semiconductor. It becomes more challenging for detecting the wafer temperature without interference during epitaxially grown process. Therefore, a device for manufacturing semiconductor, which may precisely detect the wafer temperature without interference, is continually required to be improved.

In order to solve the above-mentioned problems, the instant disclosure provides a device which includes a wafer supporting structure, and a method for manufacturing semiconductor. The wafer supporting structure includes a transparent ring that is beneficial for an accurate control of the wafer temperature during the manufacturing process, especially for the epitaxial growth process. Therefore, the device of the instant disclosure may improve the issue of the wafer temperature controlling.

Figure 1B:
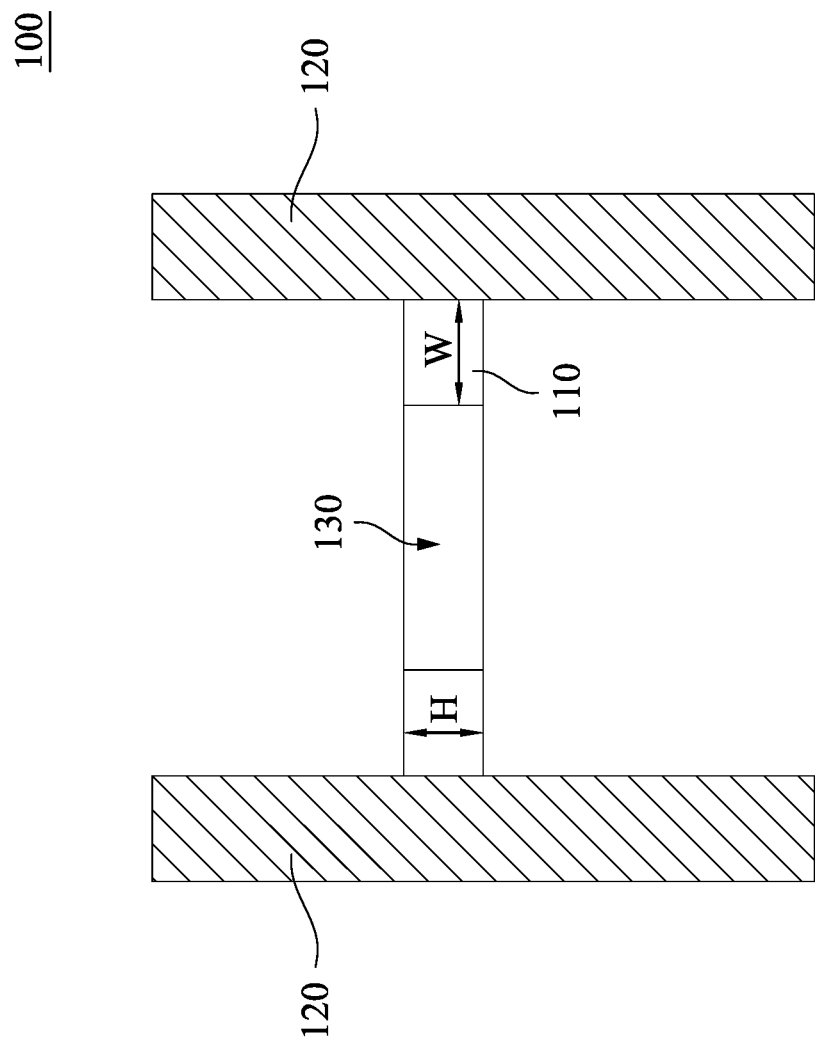
FIG. 1B is a cross-sectional view along the line A-A' in FIG. 1A according to some embodiments.

Please refer to FIGS. 1A and 1B. FIG. 1A is a three dimensional view of a wafer supporting structure 100 in accordance with some embodiments. FIG. 1B is a cross-sectional view along the line A-A' in FIG. 1A according to some embodiments.

FIGS. 1A and 1B illustrate a wafer supporting structure 100 in semiconductor manufacturing, which may support and rotate a wafer during epitaxially grown process. A wafer supporting structure 100 includes a transparent ring 110 and at least two arms 120, which the arms 120 are individually connected to opposite sides of the transparent ring 110 as shown in FIGS. 1A and 1B. One should note that some of the structures have been omitted for the purpose of simplicity and clarity. In some embodiments, the transparent ring 110 has a width W which is defined by an inner surface 111 and an outer surface 112 of the transparent ring 110. In accordance with some embodiments, the arms 120 are in contact with a portion of the outer surface 112 of the transparent ring 110, and a hole 130 is in a central region of the transparent ring 110 and surrounded by the inner surface 111 of the transparent ring 110. A region between the inner surface 111 and the outer surface 112 of the transparent ring 110 may define a reading pathway for a sensor passing through the transparent ring 110, and it will be discussed in greater detail in FIG. 6.

In some embodiments, the transparent ring 110 is made of high transmittance materials, for example, quartz. In addition, the material of the arms 120 may be a high transmittance material, for example, quartz. According to some embodiments, the transparent ring 110 has a constant thickness H which is defined by an upper surface and a lower surface of the transparent ring 110 as shown in FIGS. 1A and 1B. Therefore, the transparent ring 110 has a flat surface in accordance with some embodiments. The thickness H of the transparent ring 110 may be about 0.1 cm to about 10 cm.

Figure 2A:
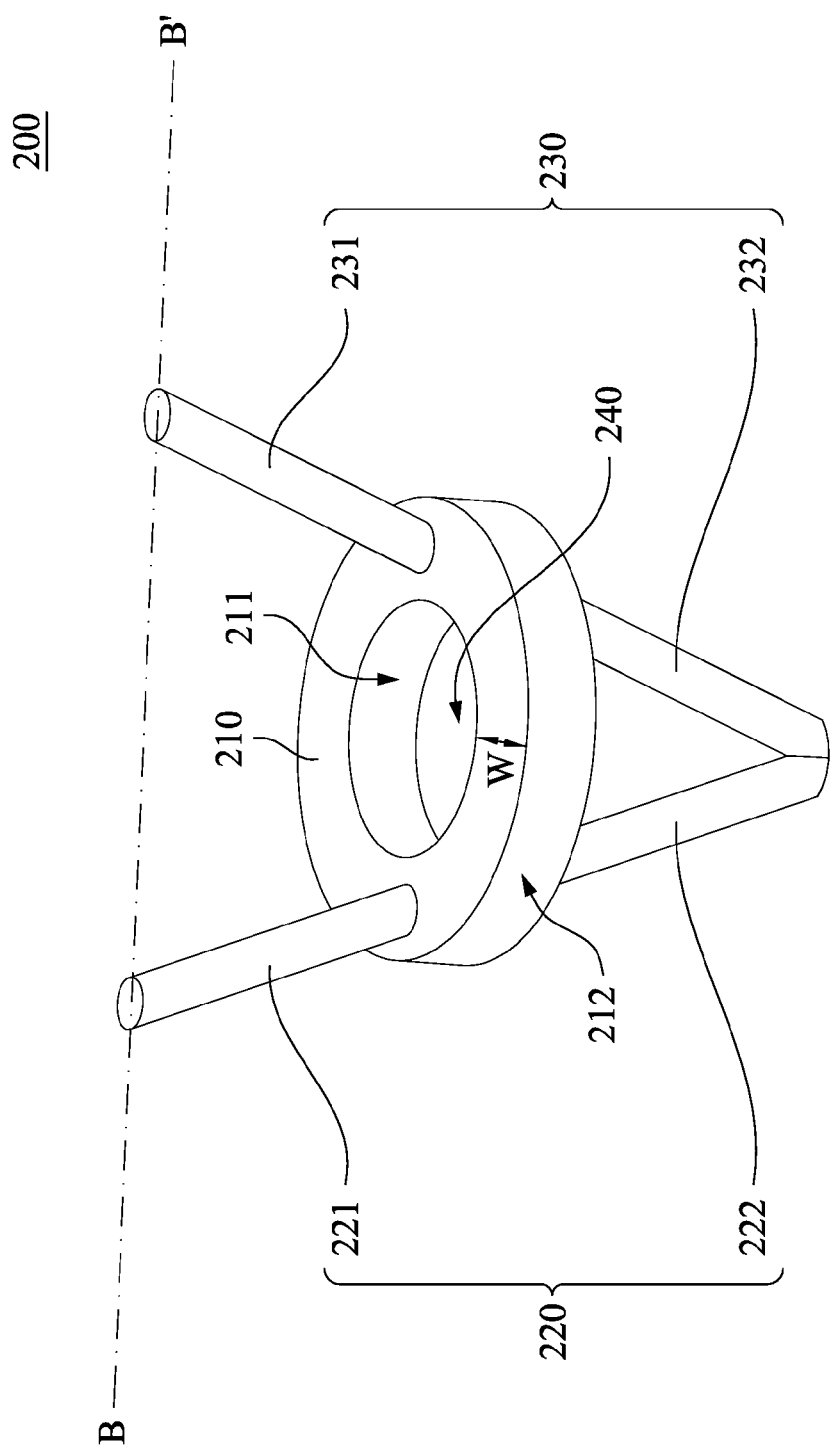
FIG. 2A is a three dimensional view of a wafer supporting structure in accordance with some embodiments.

Referring to FIG. 2A, FIG. 2A is a three dimensional view of a wafer supporting structure 200 in accordance with some embodiments.

FIG. 2A illustrates a wafer supporting structure 200 in semiconductor manufacturing, which may support and rotate a wafer during epitaxially grown process. A wafer supporting structure 200 includes a transparent ring 210 and a claw which includes a first arm 220 and a second arm 230 as shown in FIG. 2A. One should note that some of the structures have been omitted for the purpose of simplicity and clarity. In some embodiments, the transparent ring 210 is interposed into the first arm 220 and the second arm 230 of the claw, and the first arm 220 and the second arm 230 are connected at a central point. The transparent ring 210 may be concentric to the projection of the central point. In addition, the transparent ring 210 has a width W which is defined by an inner surface 211 and an outer surface 212 of the transparent ring 210 as shown in FIG. 2A. A hole 240 is in a central region of the transparent ring 210 and surrounded by the inner surface 211 of the transparent ring 210 in accordance with some embodiments. A region between the inner surface 211 and the outer surface 212 of the transparent ring 210 may define a reading pathway for a sensor passing through the transparent ring 210, and it will be discussed in greater detail in FIG. 7.

Figure 2B:
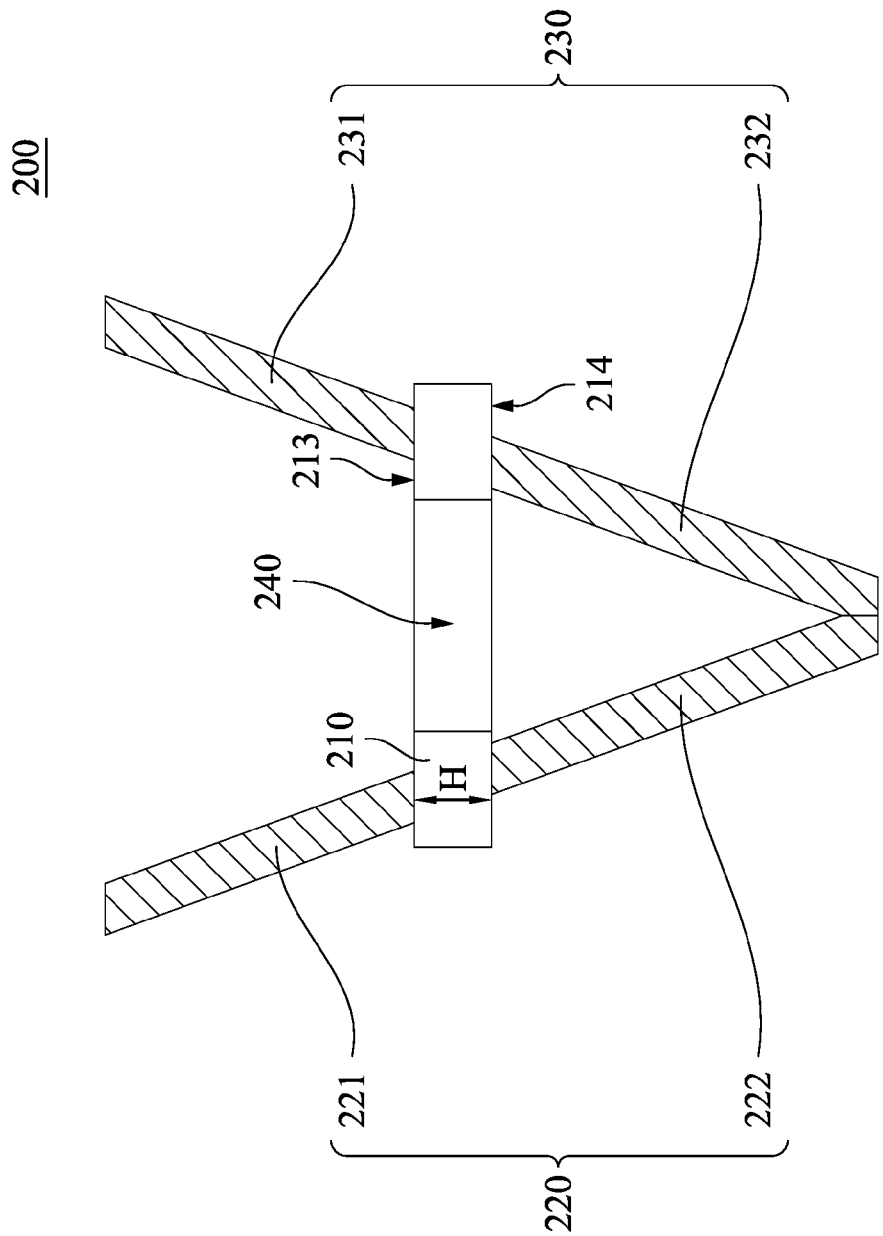
FIG. 2B is a cross-sectional view along the line B-B' in FIG. 2A according to some embodiments.

Continuing in FIG. 2B, FIG. 2B is a cross-sectional view along the line B-B' in FIG. 2A according to some embodiments.

In some embodiments, the transparent ring 210 has a constant thickness H which is defined by an upper surface 213 and a lower surface 214 of the transparent ring 210. Therefore, the transparent ring 210 has a flat surface in accordance with some embodiments. As shown in FIG. 2B, the first arm 220 has a first portion 221 and a second portion 222, and the second arm 230 has a third portion 231 and a fourth portion 232. Particularly, the first portion 221 and the second portion 222 of the first arm 220 are aligned along a line, and the third portion 231 and the fourth portion 232 of the second arm 230 are aligned along another line. For instance, the first portion 221 of the first arm 220 and the third portion 231 of the second arm 230 are in contact with a portion of the upper surface 213 of the transparent ring 210; the second portion 222 of the first arm 220 and the fourth portion 232 of the second arm 230 are connected to each other and in contact with a portion of the lower surface 214 of the transparent ring 210. In some embodiments, the transparent ring 210 and the claw, which includes a first arm 220 and a second arm 230, are made of high transmittance materials, for example, quartz. The thickness H of the transparent ring 210 may be about 0.1 cm to about 10 cm.

Figure 2C:
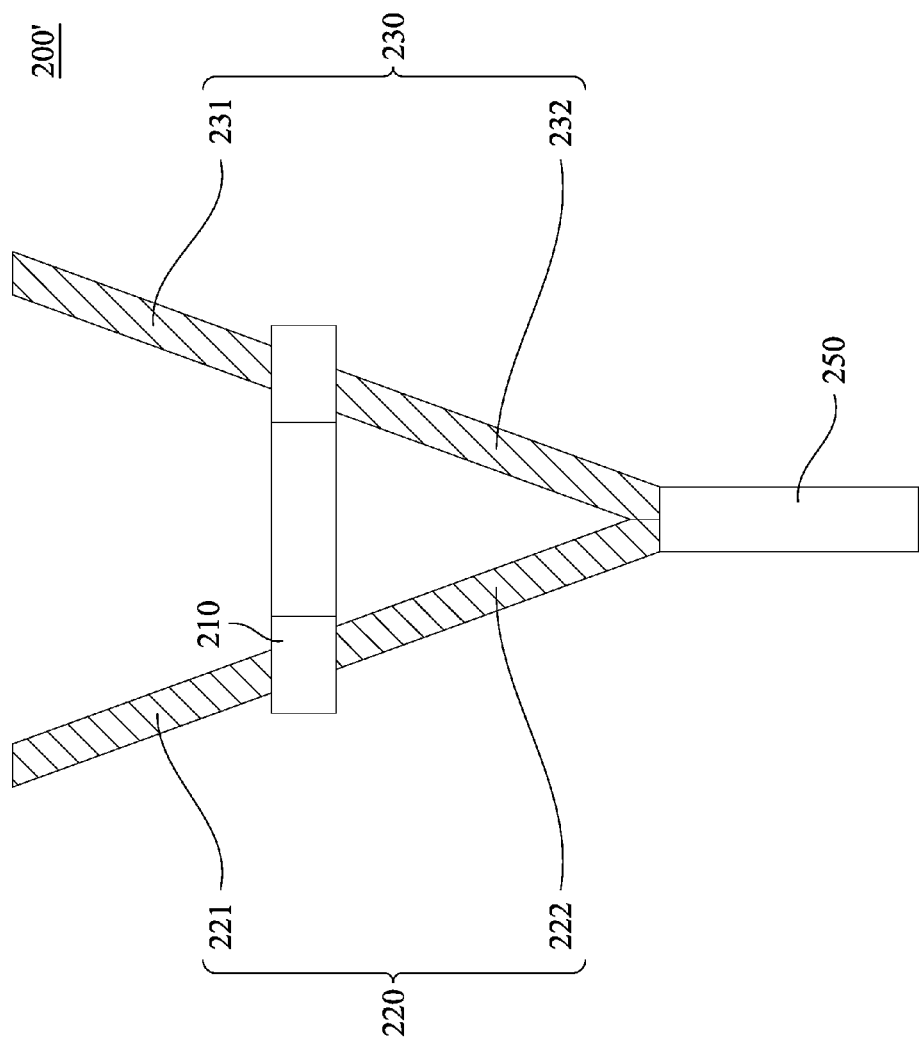
FIG. 2C is a cross-sectional view of a wafer supporting structure according to some embodiments.

Now refer to FIG. 2C. FIG. 2C is a cross-sectional view of a wafer supporting structure 200' according to some embodiments.

FIG. 2C illustrates that a wafer supporting structure 200' include a transparent ring 210, a claw which includes a first arm 220 and a second arm 230, and a shaft 250. In some embodiments, the transparent ring 210 is interposed into the first arm 220 and the second arm 230 of the claw, and the first arm 220 and the second arm 230 are connected at a central point. The transparent ring 210 may be concentric to the projection of the central point. The shaft 250 is connected to the first arm 220 and the second arm 230 at the central point of the claw as shown in FIG. 2C.

In accordance with some embodiments, the difference between the wafer supporting structure 200' and wafer supporting structure 200 is that the wafer supporting structure 200' further includes the shaft 250, which is connected to the claw at the central point. The material of the shaft 250 may be a high transmittance material, for example, quartz. Other details in FIG. 2C may refer to the descriptions of the counterparts in FIGS. 2A and 2B, and hence are not repeated herein.

Figure 3A:
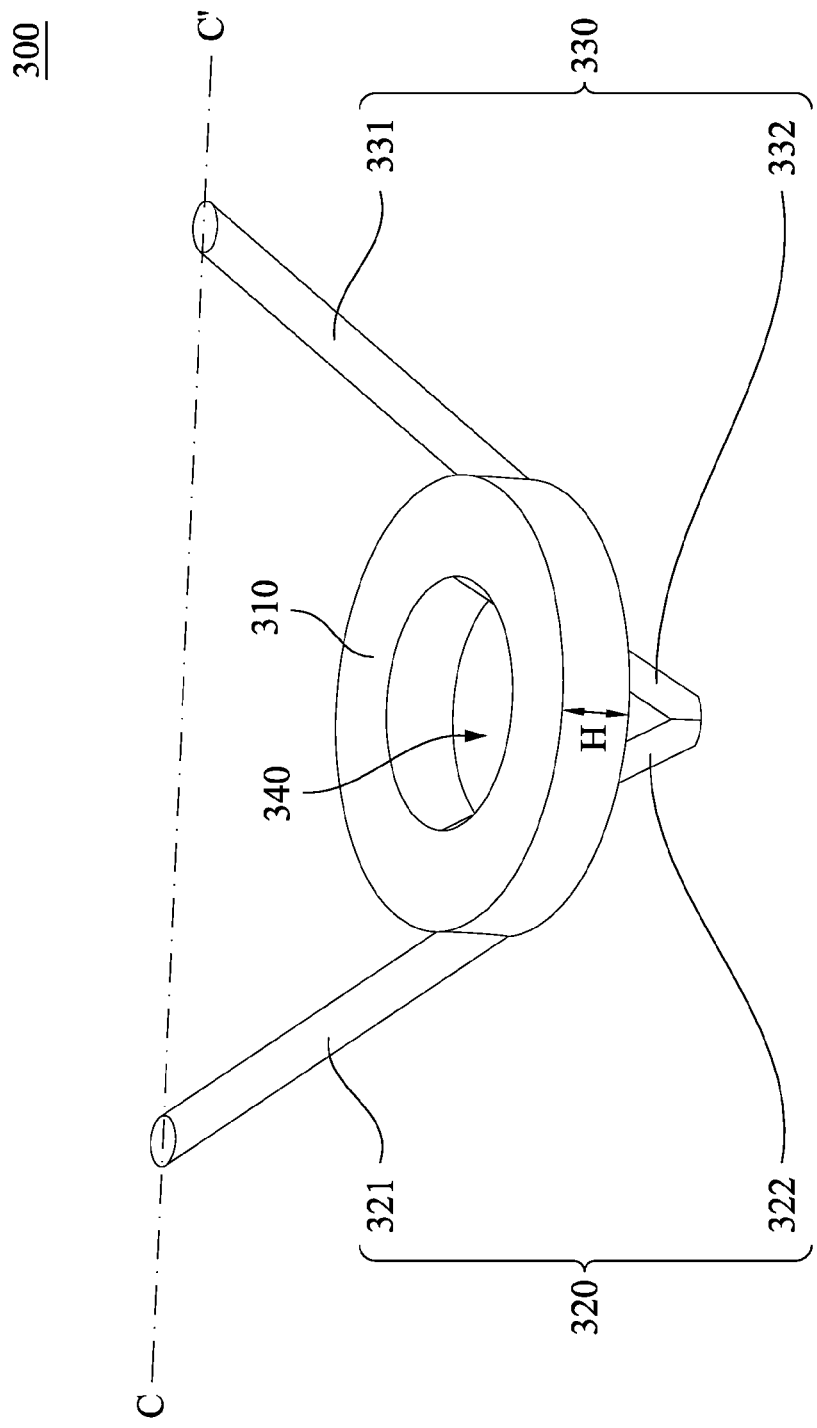
FIG. 3A is a three dimensional view of a wafer supporting structure in accordance with some embodiments.

Please refer to FIG. 3A. FIG. 3A is a three dimensional view of a wafer supporting structure 300 in accordance with some embodiments.

FIG. 3A illustrates a wafer supporting structure 300 in semiconductor manufacturing, which may support and rotate a wafer during epitaxially grown process. A wafer supporting structure 300 includes a transparent ring 310 and a claw which includes a first arm 320 and a second arm 330 as shown in FIG. 3A. One should note that some of the structures have been omitted for the purpose of simplicity and clarity. In some embodiments, the transparent ring 310 is interposed into the first arm 320 and the second arm 330 of the claw, and the first arm 320 and the second arm 330 are connected at a central point. The transparent ring 310 may be concentric to the projection of the central point. As shown in FIG. 3A, the transparent ring 310 has a constant thickness H which is defined by an upper surface and a lower surface of the transparent ring 310. Therefore, the transparent ring 310 has a flat surface in accordance with some embodiments. The thickness H of the transparent ring 310 may be about 0.1 cm to about 10 cm.

Figure 3B:
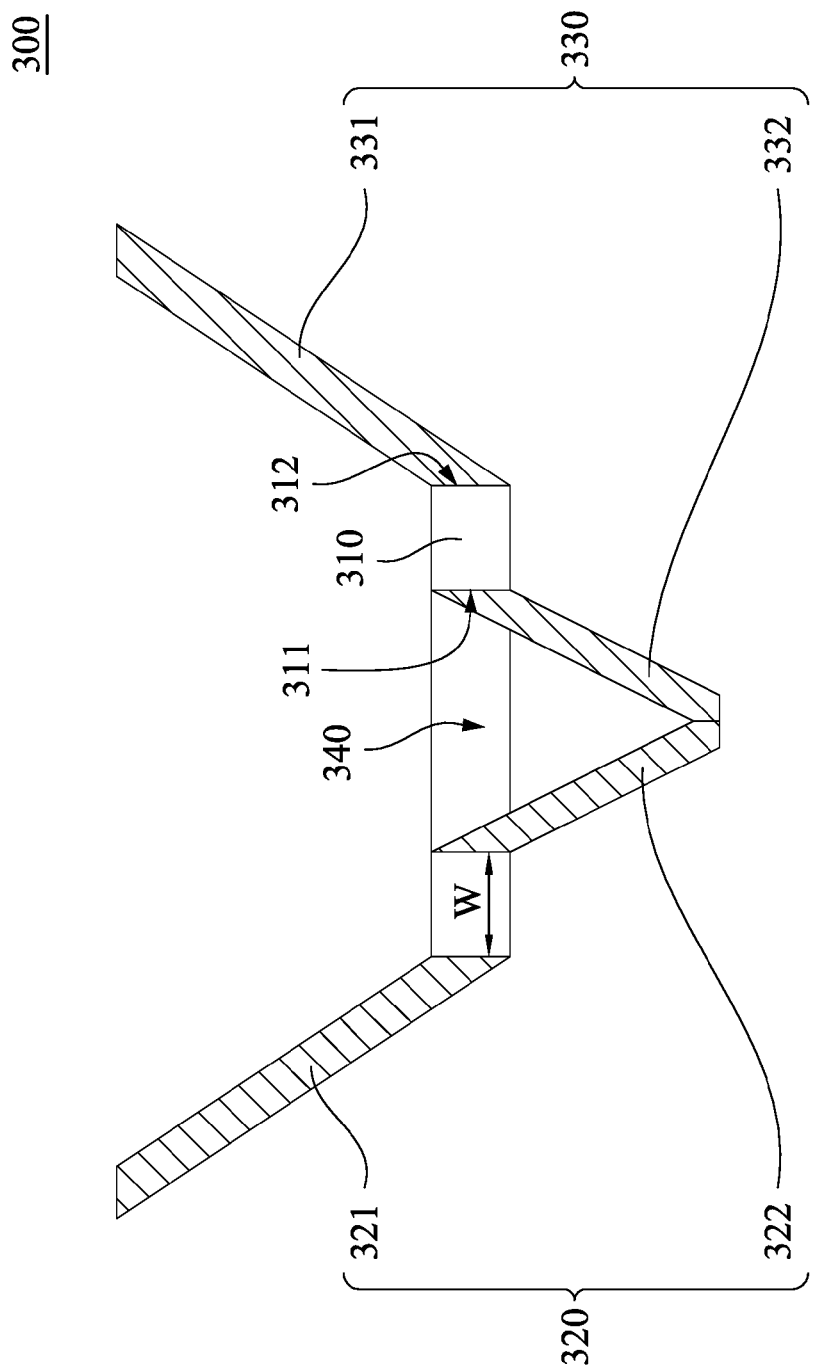
FIG. 3B is a cross-sectional view along the line C-C' in FIG. 3A according to some embodiments.

Next, refer to FIG. 3B. FIG. 3B is a cross-sectional view along the line C-C' in FIG. 3A according to some embodiments.

In some embodiments, the transparent ring 310 has a width W which is defined by an inner surface 311 and an outer surface 312 of the transparent ring 310 as shown in FIG. 3B. A hole 340 is in a central region of the transparent ring 310 and surrounded by the inner surface 311 of the transparent ring 310 in accordance with some embodiments. As shown in FIG. 3B, the first arm 320 has a first portion 321 and a second portion 322, and the second arm 330 has a third portion 331 and a fourth portion 332. For instance, the first portion 321 of the first arm 320 and the third portion 331 of the second arm 330 are in contact with a portion of the outer surface 312 of the transparent ring 310; the second portion 322 of the first arm 320 and the fourth portion 332 of the second arm 330 are connected to each other and in contact with a portion of the inner surface 311 of the transparent ring 310.

A region between the inner surface 311 and the outer surface 312 of the transparent ring 310 may define a reading pathway for a sensor passing through the transparent ring 310, and it will be discussed in greater detail in FIG. 8. In some embodiments, the transparent ring 310 is made of high transmittance materials, for example, quartz. Besides, the material of the claw, which includes a first arm 320 and a second arm 330, may be a high transmittance material, for example, quartz.

Figure 3C:
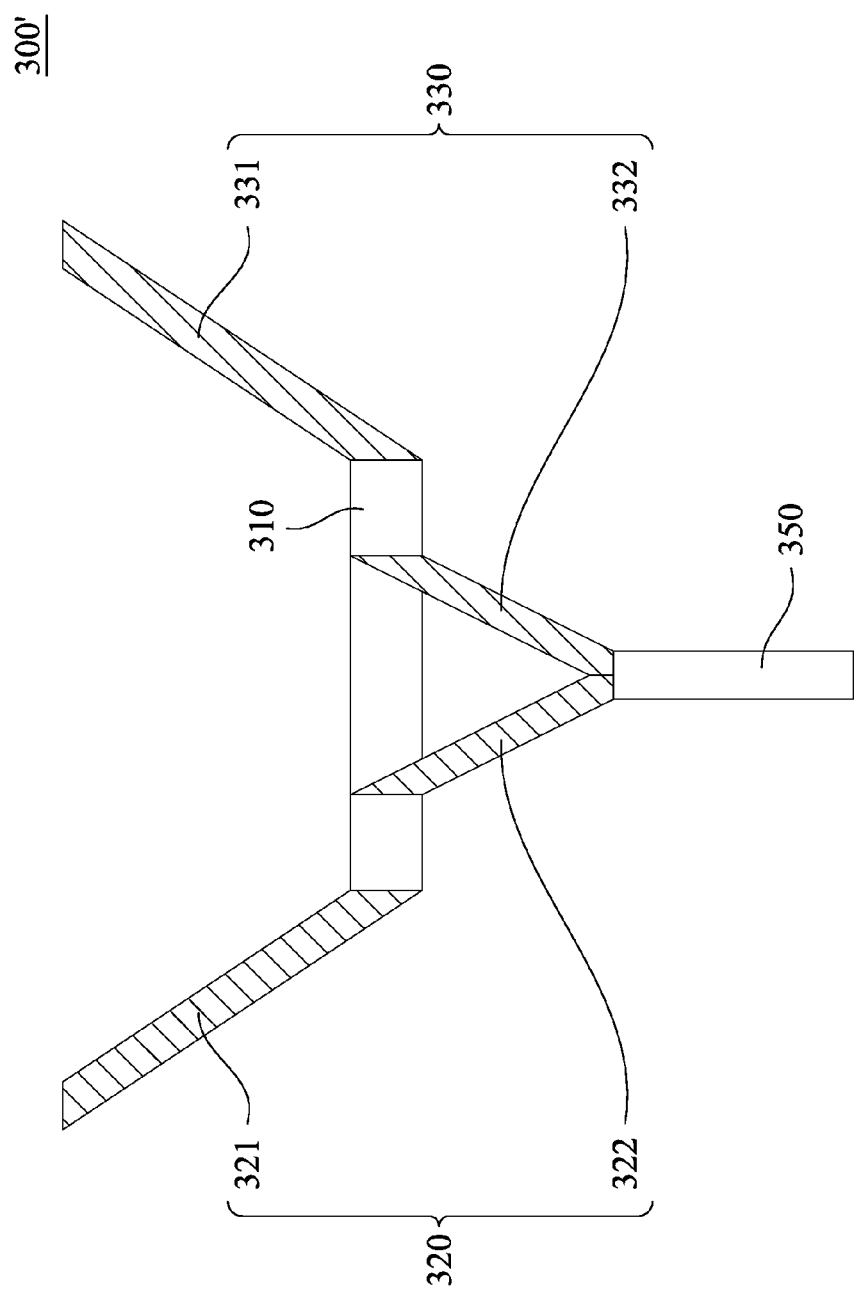
FIG. 3C is a cross-sectional view of a wafer supporting structure according to some embodiments.

Referring to FIG. 3C, FIG. 3C is a cross-sectional view of a wafer supporting structure 300' according to some embodiments.

FIG. 3C illustrates that a wafer supporting structure 300' include a transparent ring 310, a claw which includes a first arm 320 and a second arm 330, and a shaft 350. In some embodiments, the transparent ring 310 is interposed into the first arm 320 and the second arm 330 of the claw, and the first arm 320 and the second arm 330 are connected at a central point. The transparent ring 310 may be concentric to the projection of the central point. The shaft 350 is connected to the first arm 320 and the second arm 330 at the central point of the claw as shown in FIG. 3C.

In accordance with some embodiments, the difference between the wafer supporting structure 300' in FIG. 3C and the wafer supporting structure 300 in FIG. 3B is that the wafer supporting structure 300' further includes the shaft 350, which is connected to the claw at the central point. The material of the shaft 350 may be a high transmittance material, for example, quartz. Other details in FIG. 3C may refer to the descriptions of the counterparts in FIGS. 3A and 3B, and hence are not repeated herein.

Figure 4A:
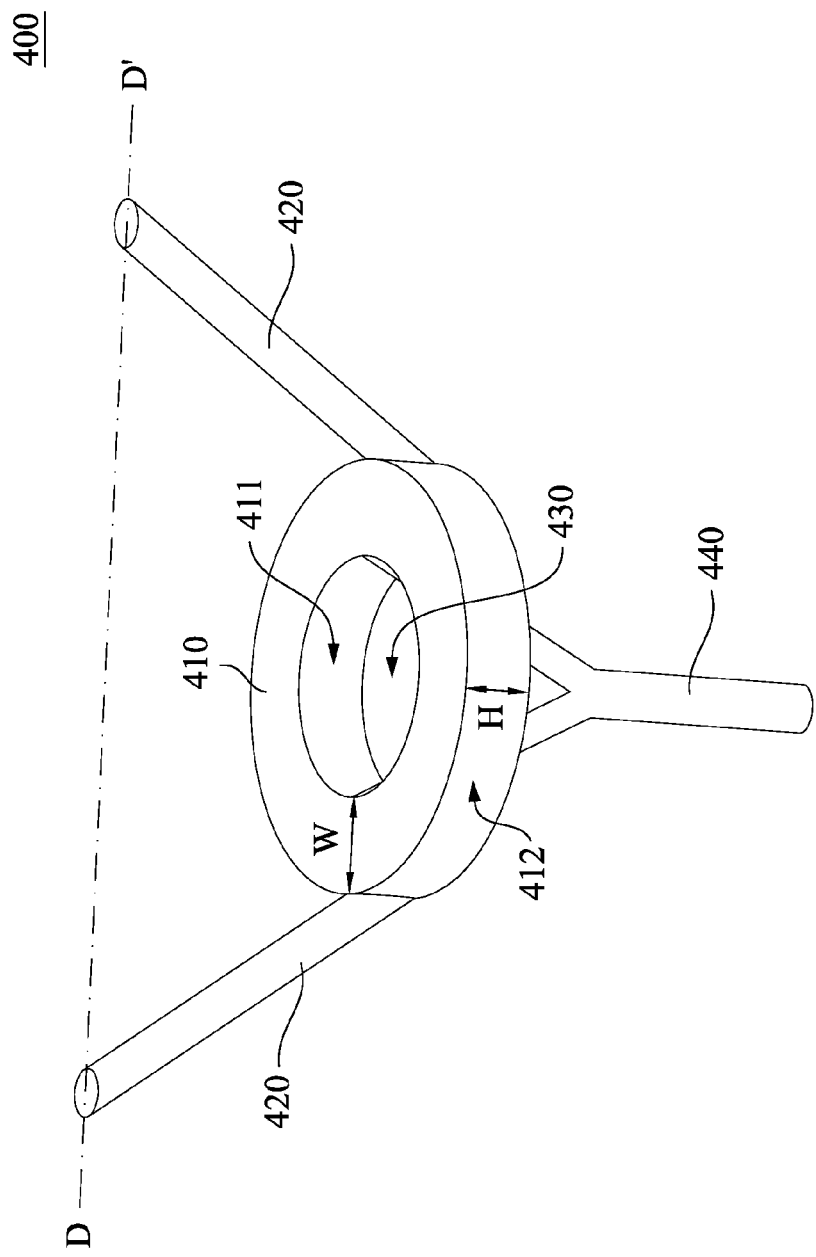
FIG. 4A is a three dimensional view of a wafer supporting structure in accordance with some embodiments.
Figure 4B:
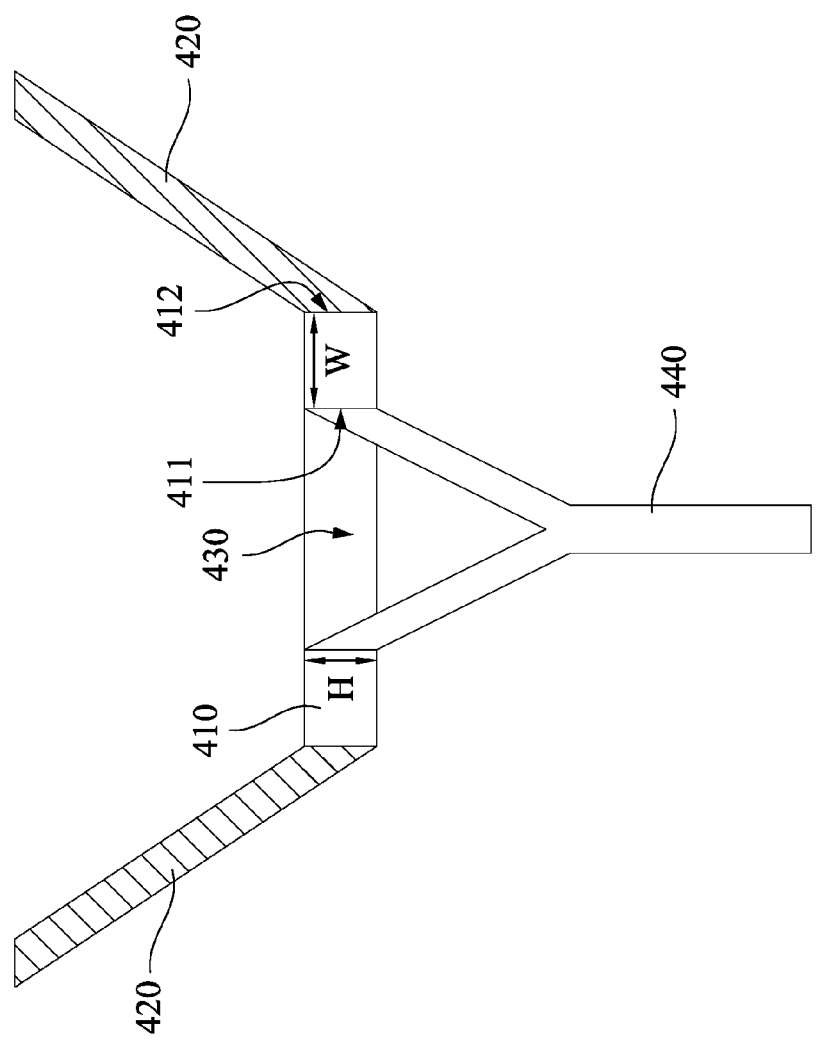
FIG. 4B is a cross-sectional view along the line D-D' in FIG. 4A according to some embodiments.

Please refer to FIGS. 4A and 4B. FIG. 4A is a three dimensional view of a wafer supporting structure 400 in accordance with some embodiments. FIG. 4B is a cross-sectional view along the line D-D' in FIG. 4A according to some embodiments.

FIGS. 4A and 4B illustrate a wafer supporting structure 400 in semiconductor manufacturing, which may support and rotate a wafer during epitaxially grown process. In some embodiments, a wafer supporting structure 400 includes a transparent ring 410, at least two arms 420 and a shaft 440, which the transparent ring 410 has an inner surface 411 and an outer surface 412. One should note that some of the structures have been omitted for the purpose of simplicity and clarity. As shown in FIGS. 4A and 4B, the arms 420 are in contact with a portion of the outer surface 412 of the transparent ring 410, and the shaft 440 is in contact with a portion of the inner surface 411 of the transparent ring 410.

More particularly, but not by way of limitation, the shaft 440 is Y-shaped or column-shaped. As shown in FIGS. 4A and 4B, the shaft 440 is Y-shaped. According to some embodiments, a hole 430 is in a central region of the transparent ring 410 and surrounded by the inner surface 411 of the transparent ring 410.

In some embodiments, the transparent ring 410 has a width W which is defined by the inner surface 411 and the outer surface 412 of the transparent ring 410 as shown in FIGS. 4A and 4B. A region between the inner surface 411 and the outer surface 412 of the transparent ring 410 may define a reading pathway for a sensor passing through the transparent ring 410, and it will be discussed in greater detail in FIG. 8.

In some embodiments, the transparent ring 410 is made of high transmittance materials, for example, quartz. In addition, the material of the arms 420 may be a high transmittance material, for example, quartz. According to some embodiments, the transparent ring 410 has a constant thickness H which is defined by an upper surface and a lower surface of the transparent ring 410 as shown in FIGS. 4A and 4B. Therefore, the transparent ring 410 has a flat surface in accordance with some embodiments. The thickness H of the transparent ring 410 may be about 0.1 cm to about 10 cm.

Next, please refer to FIG. 4C. FIG. 4C is a cross-sectional view of a wafer supporting structure 400a according to some embodiments.

FIG. 4C illustrates that a wafer supporting structure 400a include a transparent ring 410, at least two arms 420, at least two first pins 450, at least two second pins 460 and a shaft 440, which the transparent ring 410 has an inner surface 411 and an outer surface 412. In some embodiments, the transparent ring 410 is connected to the arms 420 through the first pins, which are in contact with the outer surface 412 of the transparent ring 410 and the arms 420. In other words, each of the first pins 450 is disposed between each arm 420 and the outer surface 412 of the transparent ring 410, and connects each arm 420 and the transparent ring 410 as shown in FIG. 4C. Furthermore, the transparent ring 410 is connected to the shaft 440 through the second pins 460, which are in contact with the inner surface 411 of the transparent ring 410 and the shaft 440 according to some embodiments. In other words, each of the second pins 460 is disposed between the shaft 440 and the inner surface 411 of the transparent ring 410, and connects the shaft 440 and the transparent ring 410 as shown in FIG. 4C.

In accordance with some embodiments, the difference between the wafer supporting structure 400a in FIG. 4C and the wafer supporting structure 400 in FIG. 4B is that the wafer supporting structure 400a further includes the first pins 450 and the second pins 460, which the first pins 450 connect the arms 420 and the transparent ring 410, and the second pins 460 connect the shaft 440 and the transparent ring 410. The material of the first pins 450 and the second pins 460 may be a high transmittance material, for example, quartz. Other details in FIG. 4C may refer to the descriptions of the counterparts in FIGS. 4A and 4B, and hence are not repeated herein.

Figure 4D:
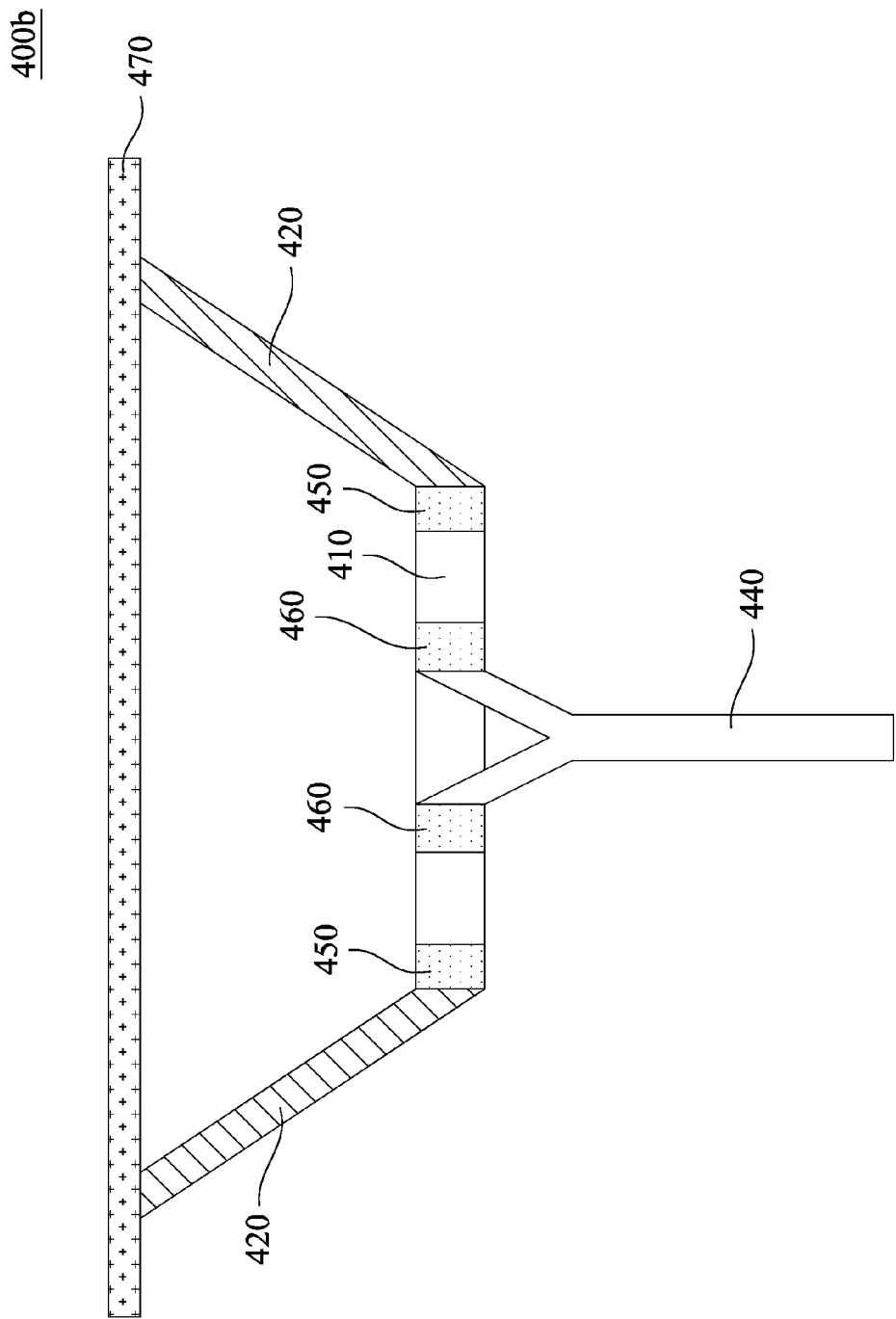
FIG. 4D is a cross-sectional view of a wafer supporting structure according to some embodiments.

Continuing in FIG. 4D, FIG. 4D is a cross-sectional view of a wafer supporting structure 400b according to some embodiments.

FIG. 4D illustrates that a wafer supporting structure 400b include a transparent ring 410, at least two arms 420, at least two first pins 450, at least two second pins 460, a shaft 440 and a susceptor 470. In some embodiments, the transparent ring 410 is connected to the arms 420 through the first pins 450, which are in contact with the outer surface 412 of the transparent ring 410 and the arms 420. Furthermore, the transparent ring 410 is connected to the shaft 440 through the second pins 460, which are in contact with the inner surface 411 of the transparent ring 410 and the shaft 440 according to some embodiments. In some embodiments, a susceptor 470 disposed over the arms 420 and the transparent ring 410. More particularly, but not by way of limitation, the susceptor 470 is mounted on the arms 420 and horizontal to the transparent ring 410.

In accordance with some embodiments, the difference between the wafer supporting structure 400b in FIG. 4D and the wafer supporting structure 400a in FIG. 4C is that the wafer supporting structure 400b further includes susceptor 470, which is mounted on the arms 420 and mechanically supports a wafer for epitaxial growth. The susceptor 470 may be made of transparent materials such as quartz, or non-transparent materials such as silicon carbide, graphite with a silicon carbide coating and the like. Other details in FIG. 4D may refer to the descriptions of the counterparts in FIGS. 4A through 4C, and hence are not repeated herein.

Figure 5A:
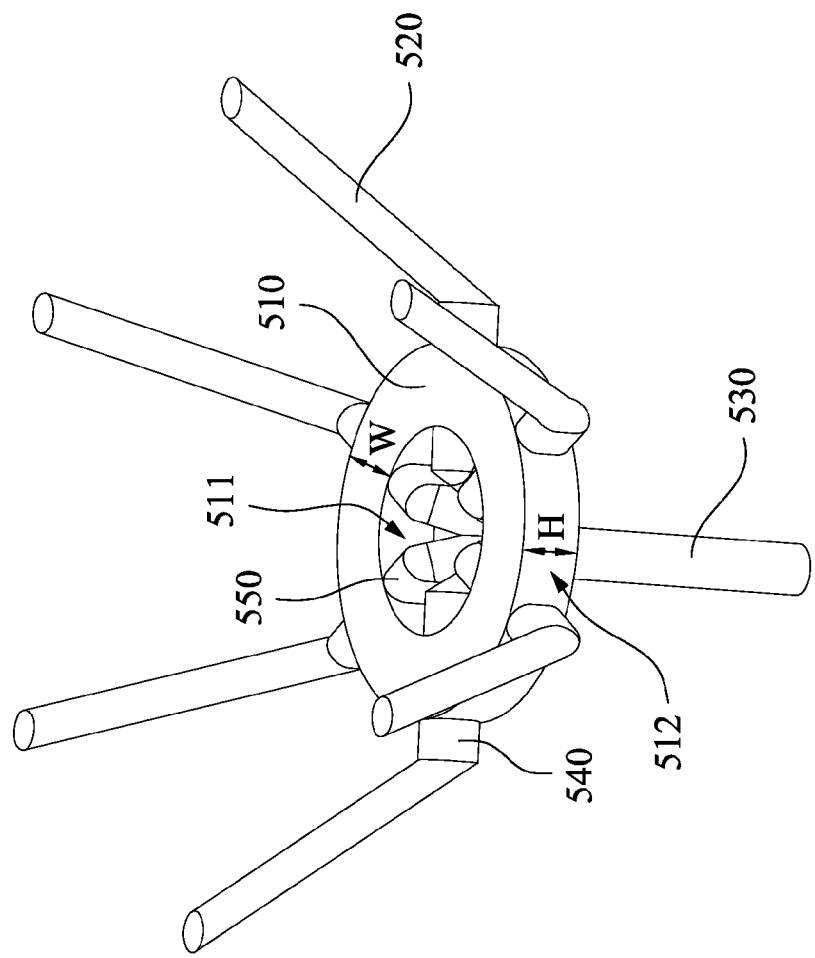
FIG. 5A is a three dimensional view of a wafer supporting structure in accordance with some embodiments.
Figure 5B:
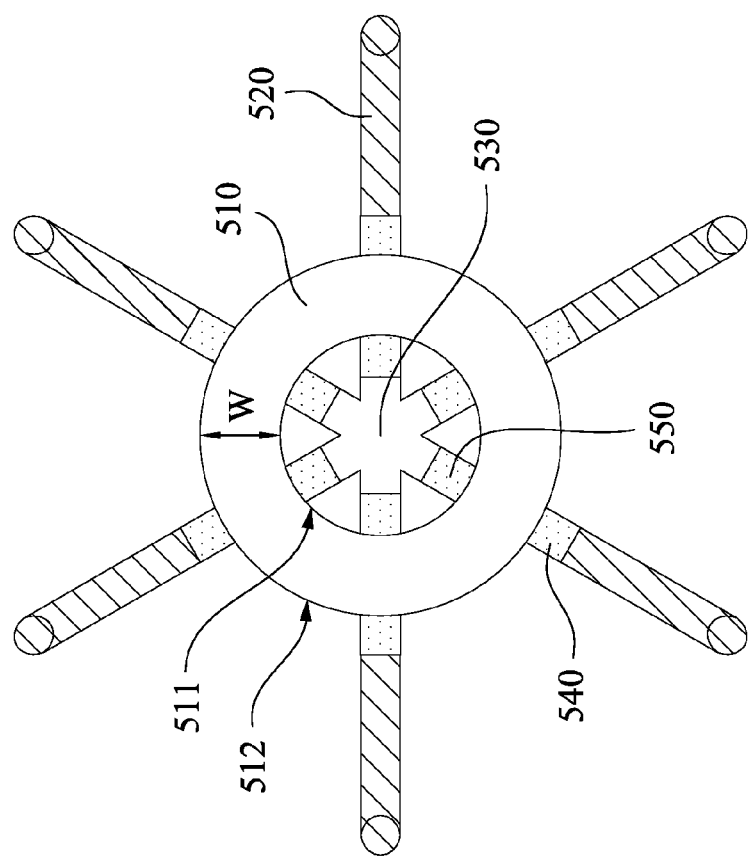
FIG. 5B is a top view of a wafer supporting structure according to some embodiments.

Please refer to FIGS. 5A and 5B. FIG. 5A is a three dimensional view of a wafer supporting structure 500 in accordance with some embodiments. FIG. 5B is a top view of a wafer supporting structure 500 according to some embodiments.

FIGS. 5A and 5B illustrate a wafer supporting structure 500 in semiconductor manufacturing, which may support and rotate a wafer during epitaxially grown process. As shown in FIGS. 5A and 5B, a wafer supporting structure 400 includes a transparent ring 510, six arms 520, a shaft 530, six first pins 540 and six second pins 550, which the transparent ring 510 has an inner surface 511 and an outer surface 512. One should note that some of the structures have been omitted for the purpose of simplicity and clarity. In some embodiments, six arms 520 surround the transparent ring 510, and connected to the transparent ring 510 through six first pins 540 which are in contact with the outer surface 512 of the transparent ring 510 and the arms 520. Furthermore, the shaft 530 is claw-shaped and has six branches according to an embodiment as shown in FIGS. 5A and 5B. In some embodiments, six branches of the shaft 530 are connected to the transparent ring 510 through six second pins 550, which are individually in contact with each branch of the shaft 530 and in contact with the inner surface 511 of the transparent ring 510.

In some embodiments, the transparent ring 510 has a width W which is defined by the inner surface 511 and the outer surface 512 of the transparent ring 510 as shown in FIGS. 5A and 5B. A region between the inner surface 511 and the outer surface 512 of the transparent ring 510 may define a reading pathway for a sensor passing through the transparent ring 510, and it will be discussed in greater detail in FIG. 8.

In some embodiments, the transparent ring 510 is made of high transmittance materials, for example, quartz. In addition, the material of the arms 520 may be a high transmittance material, for example, quartz. According to some embodiments, the transparent ring 510 has a constant thickness H which defined by an upper surface and a lower surface of the transparent ring 510 as shown in FIGS. 5A and 5B. Therefore, the transparent ring 510 has a flat surface in accordance with some embodiments. The thickness H of the transparent ring 510 may be about 0.1 cm to about 10 cm.

Figure 6:
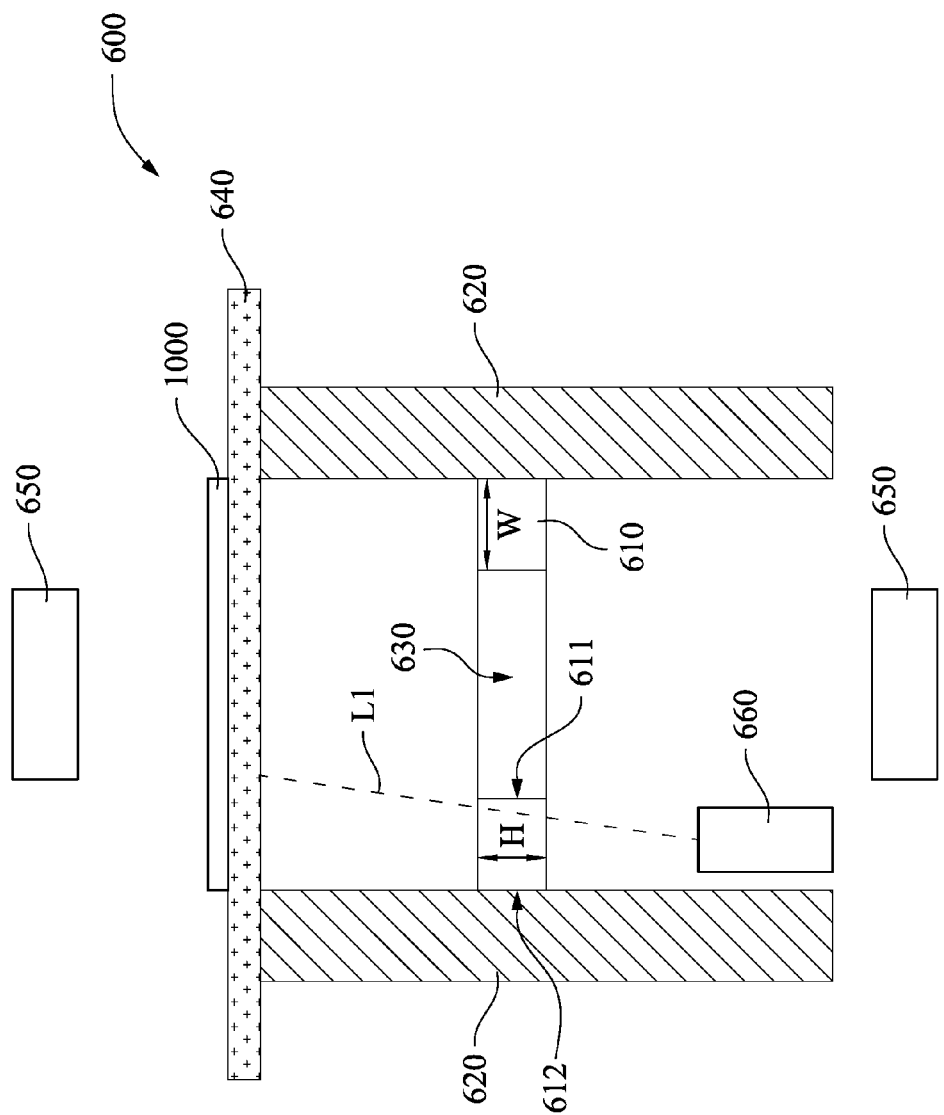
FIG. 6 is a cross-sectional view of a device according to some embodiments.

Please refer to FIG. 6. FIG. 6 is a cross-sectional view of a device 600 according to some embodiments.

FIG. 6 illustrate that a device 600 for manufacturing semiconductor includes a wafer supporting structure, a heating source 650 and a sensor 660, which the wafer supporting structure includes a transparent ring 610, at least two arms 620, and a susceptor 640. In more detail, the heating source 650 may be implemented by using resistance heaters, radio frequency inductive heaters, lamps, lamp banks, the like or a combination thereof. For instance, the heating source 650 may be implemented by using two lamp banks, namely an upper lamp bank and a lower lamp bank. In addition, the sensor 660 is a temperature sensor according to some embodiments. One should note that some of the structures have been omitted for the purpose of simplicity and clarity. In some embodiments, the arms 620 are connected to the transparent ring 610, the susceptor 640 is mounted on the arms 620 and disposed over the transparent ring 610, the heating source 650 disposed adjacent to the wafer supporting structure, and the sensor 660 is disposed below the transparent ring 610 of the wafer supporting structure and configured to allow a sensing through the transparent ring 610.

According to some embodiments, a track (not shown), which the arms 620 are mounted thereon, is disposed below the wafer supporting structure. During the epitaxial growth process, the arms 620 may rotate the wafer, which is placed on the wafer supporting structure, along a route of the track in accordance with some embodiments.

In some embodiments, the sensor 660 is used to sense a temperature signal of a wafer 1000, which is on the susceptor 640, by infra-red radiation. In greater detail, the transparent ring 610 is between the susceptor 640 and the sensor 660, so that the infra-red radiation from the wafer 1000 may pass through the transparent ring 610 (indicated by the dashed line L1) and be detected by the sensor 660 as shown in FIG. 6.

In addition, the transparent ring 610 has a width W, which is defined by an inner surface 611 and an outer surface 612 of the transparent ring 610. More particularly, but not by way of limitation, the arms 620 are individually connected to opposite sides of the transparent ring 610, and in contact with the outer surface 612 of the transparent ring 610 according to some embodiments. Besides, the upper lamp bank and the lower lamp bank of the heating sources 650 shown in FIG. 6 are separately disposed over and below the wafer supporting structure, and used for heating the wafer 1000 disposed on the susceptor 640. As a result, the top side of the wafer 1000 is heated by the radiant thermal transfer from the upper lamp bank of the heating sources 650. The backside of the wafer 1000 is heated by the conduction thermal transfer from the heated susceptor 640, which is heated by the radiant thermal transfer from the lower lamp bank of the heating sources 650.

The configuration of the heating source 650 and the sensor 660 is merely an example. One person skilled in the art will recognize many variations, alternatives, and modifications.

Furthermore, the susceptor 640 is employed to mechanically support the wafer 1000, and helps to protect the backside of the wafer 1000 so as to ensure uniform heating of the wafer 1000. In other embodiments, the wafer supporting structure of the device 600 does not include the susceptor 640, so that the wafer 1000 is disposed on the arms 620. In accordance with said embodiments, the backside of the wafer 1000 is directly heated by the radiant thermal transfer from the lower lamp bank of the heating sources 650.

In greater detail, the transparent ring 610 is horizontal to the susceptor 640 and the wafer 1000. In addition, the transparent ring 610 is a platform, which has a constant thickness H and a flat surface, so that the radiant thermal transfer from the lower lamp bank of the heating sources 650 through the transparent ring 610 may uniformly heat the backside of the wafer 1000. Further, the transparent ring 610 with flat surface and constant thickness may reduce focusing or scattering effect from the lower lamp bank of the heating sources 650 to the wafer 1000.

More particularly, but not by way of limitation, the sensor 660 may be a pyrometer, which is used to receive the infra-red radiation (indicated by the dashed line L1) emitted from the wafer 1000 through a region from the inner surface 611 to the outer surface 612 of the transparent ring 610.

In some embodiments, a hole 630 is in a central region of the transparent ring 610 and surrounded by the inner surface 611 of the transparent ring 610. In accordance with said embodiments, since the hole 630 exists in the central region of the transparent ring 610, a horizontal area of the transparent ring 610 is smaller than a circular platform. As a result, the wafer supporting structure including the transparent ring 610 may prevent an epitaxial film, for example, a silicon film, deposited thereon during the epitaxial growth process because of the small horizontal area of the transparent ring 610, so that the infra-red radiation from the wafer 1000 may pass through the region between the inner surface 611 and the outer surface 612 of the transparent ring 610 (indicated by the dashed line L1) and be accurately detected by the sensor 660.

In some embodiments, since the transparent ring 610 has the flat surface and the constant thickness H, the transparent ring 610 may be easy to mass production. Other details in FIG. 6 may refer to the descriptions of the counterparts in FIGS. 1A and 1B, and hence are not repeated herein.

Figure 7:
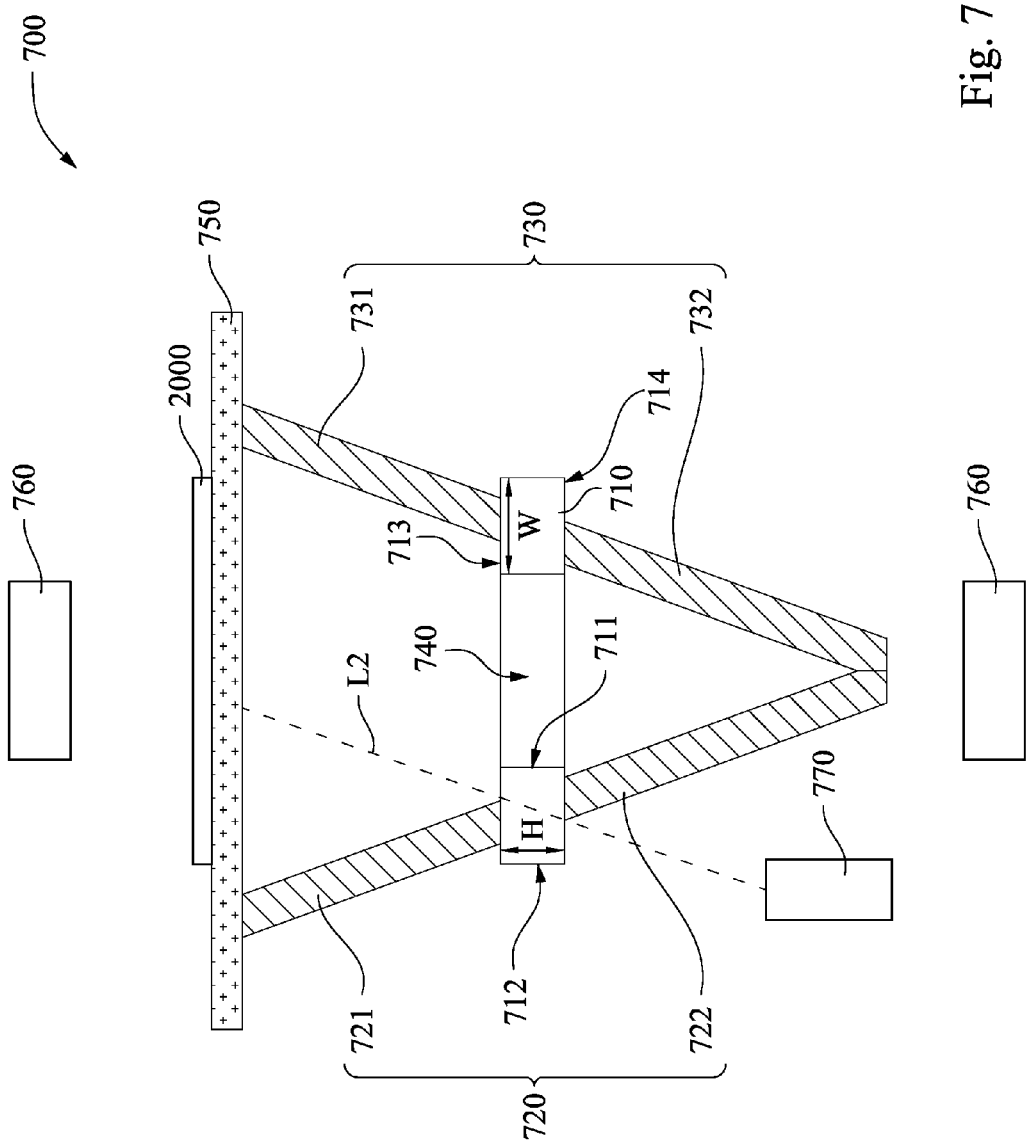
FIG. 7 is a cross-sectional view of a device according to some embodiments.

Please refer to FIG. 7. FIG. 7 is a cross-sectional view of a device 700 according to some embodiments.

FIG. 7 illustrate that a device 700 for manufacturing semiconductor includes a wafer supporting structure, a heating source 760 and a sensor 770, which the wafer supporting structure includes a transparent ring 710, a claw which includes at least two arms, namely a first arm 720 and a second arm 730, and a susceptor 750. In more detail, the heating source 760 may be implemented by using resistance heaters, radio frequency inductive heaters, lamps, lamp banks, the like or a combination thereof. For instance, the heating source 760 may be implemented by using two lamp banks, namely an upper lamp bank and a lower lamp bank. In addition, the sensor 770 is a temperature sensor according to some embodiments. One should note that some of the structures have been omitted for the purpose of simplicity and clarity.

In some embodiments, the transparent ring 710 has a constant thickness H, which is defined by an upper surface 713 and a lower surface 714 of the transparent ring 710. As shown in FIG. 7, the first arm 720 has a first portion 721 and a second portion 722, and the second arm 730 has a third portion 731 and a fourth portion 732. Particularly, the first portion 721 and the second portion 722 of the first arm 720 are aligned along a line, and the third portion 731 and the fourth portion 732 of the second arm 730 are aligned along another line. For instance, the first portion 721 of the first arm 720 and the third portion 731 of the second arm 730 are in contact with a portion of the upper surface 713 of the transparent ring 710; the second portion 722 of the first arm 720 and the fourth portion 732 of the second arm 730 are connected to each other and in contact with a portion of the lower surface 714 of the transparent ring 710. In accordance with some embodiments, the susceptor 750 is mounted on the first portion 721 of the first arm 720 and the third portion 731 of the second arm 730, and disposed over the transparent ring 710. In addition, the heating source 760 disposed adjacent to the wafer supporting structure, and the sensor 770 is disposed below the transparent ring 710 of the wafer supporting structure and configured to allow a sensing through the transparent ring 710.

According to some embodiments, a connected portion of the first arm 720 and the second arm 730 is used as a pivot point for rotation during the epitaxial growth process.

In some embodiments, the sensor 770 is used to sense a temperature signal of a wafer 2000, which is on the susceptor 750, by infra-red radiation. In greater detail, the transparent ring 710 is between the susceptor 750 and the sensor 770, so that the infra-red radiation from the wafer 2000 may pass through the transparent ring 710 (indicated by the dashed line L2) and be detected by the sensor 770 as shown in FIG. 7.

In addition, the upper lamp bank and the lower lamp bank of the heating sources 760 shown in FIG. 7 are separately disposed over and below the wafer supporting structure, and used for heating the wafer 2000 disposed on the susceptor 750. As a result, the top side of the wafer 2000 is heated by the radiant thermal transfer from the upper lamp bank of the heating sources 760. The backside of the wafer 2000 is heated by the conduction thermal transfer from the heated susceptor 750, which is heated by the radiant thermal transfer from the lower lamp bank of the heating sources 760.

The configuration of the heating source 760 and the sensor 770 is merely an example. One person skilled in the art will recognize many variations, alternatives, and modifications.

Furthermore, the susceptor 750 is employed to mechanically support the wafer 2000, and helps to protect the backside of the wafer 2000 so as to ensure uniform heating of the wafer 2000. In other embodiments, the wafer supporting structure of the device 700 does not include the susceptor 750, so that the wafer 2000 is disposed on the first portion 721 of the first arm 720 and the third portion 731 of the second arm 730. In accordance with said embodiments, the backside of the wafer 2000 is directly heated by the radiant thermal transfer from the lower lamp bank of the heating sources 760.

In greater detail, the transparent ring 710 is horizontal to the susceptor 750 and the wafer 2000. In addition, the transparent ring 710 is a platform, which has a constant thickness H and a flat surface, so that the radiant thermal transfer from the lower lamp bank of the heating sources 760 through the transparent ring 710 may uniformly heat the backside of the wafer 2000. Further, the transparent ring 710 with flat surface and constant thickness may reduce focusing or scattering effect from the lower lamp bank of the heating sources 760 to the wafer 2000.

More particularly, but not by way of limitation, the sensor 770 may be a pyrometer, which is used to receive the infra-red radiation (indicated by the dashed line L2) emitted from the wafer 2000 through a region between the inner surface 711 and the outer surface 712 of the transparent ring 710.

In some embodiments, a hole 740 is in a central region of the transparent ring 710 and surrounded by the inner surface 711 of the transparent ring 710. In accordance with said embodiments, since the hole 740 exists in the central region of the transparent ring 710, a horizontal area of the transparent ring 710 is smaller than a circular platform. As a result, the wafer supporting structure including the transparent ring 710 may prevent an epitaxial film, for example, a silicon film, deposited thereon during the epitaxial growth process because of the small horizontal area of the transparent ring 710, so that the infra-red radiation from the wafer 2000 may pass through the region between the inner surface 711 and the outer surface 712 of the transparent ring 710 (indicated by the dashed line L2) and be accurately detected by the sensor 770.

In some embodiments, since the transparent ring 710 has the flat surface and the constant thickness H, the transparent ring 710 may be easy to mass production. Other details in FIG. 7 may refer to the descriptions of the counterparts in FIGS. 2A and 2B, and hence are not repeated herein.

Figure 8:
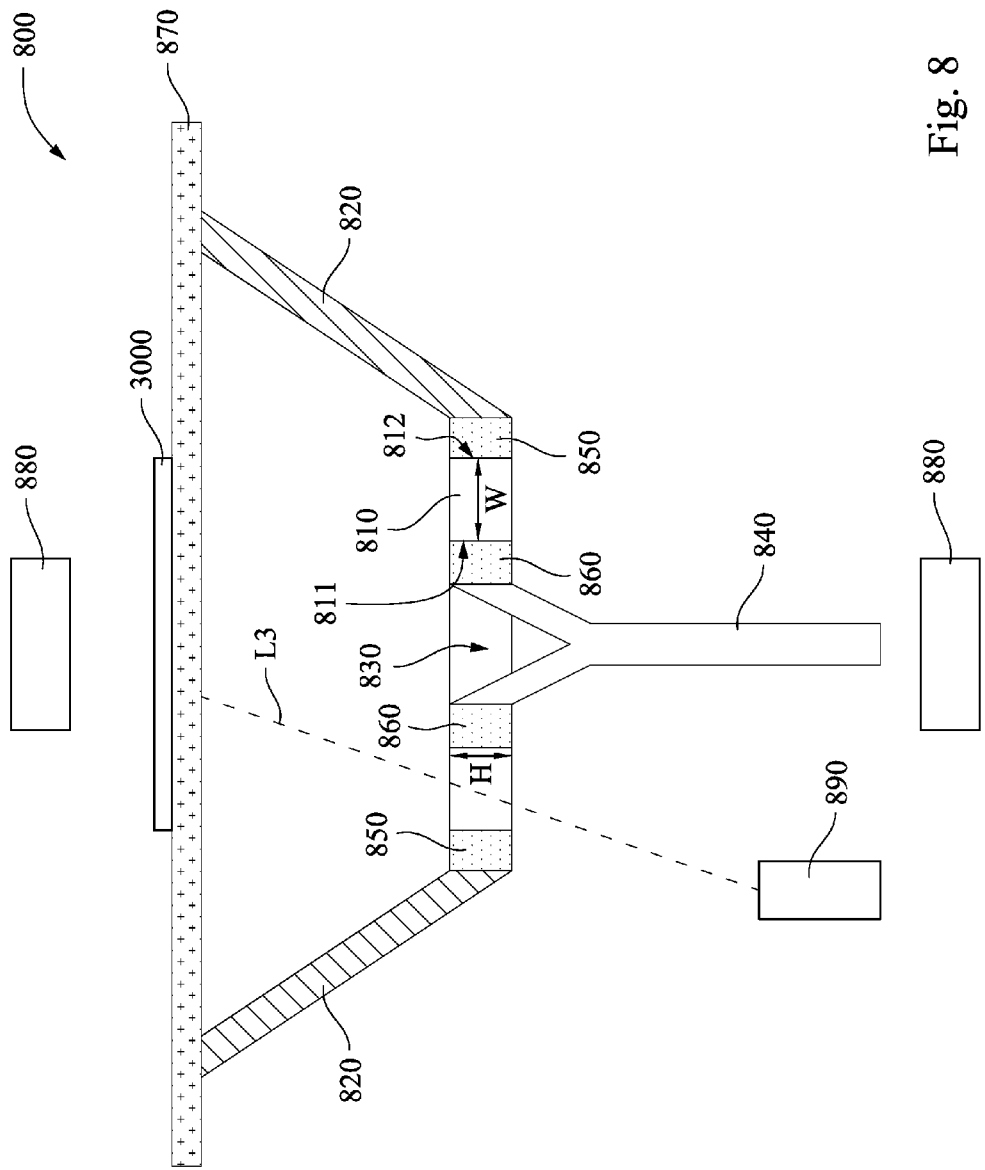
FIG. 8 is a cross-sectional view of a device according to some embodiments.

Please refer to FIG. 8. FIG. 8 is a cross-sectional view of a device 800 according to some embodiments.

FIG. 8 illustrate that a device 800 for manufacturing semiconductor includes a wafer supporting structure, a heating source 880 and a sensor 890, which the wafer supporting structure includes a transparent ring 810, at least two arms 820, at least two first pins 850, at least two second pins 860, a shaft 840 and a susceptor 870. In more detail, the heating source 880 may be implemented by using resistance heaters, radio frequency inductive heaters, lamps, lamp banks, the like or a combination thereof. For instance, the heating source 880 may be implemented by using two lamp banks, namely an upper lamp bank and a lower lamp bank. In addition, the sensor 890 is a temperature sensor according to some embodiments. One should note that some of the structures have been omitted for the purpose of simplicity and clarity.

In some embodiments, the arms 820 are connected to the transparent ring 810 through the first pins 850, the transparent ring 810 is connected to the shaft 840 through the second pins 860, the susceptor 870 is mounted on the arms 820 and disposed over the transparent ring 810, the heating source 880 disposed adjacent to the wafer supporting structure, and the sensor 890 is disposed below the transparent ring 810 and the susceptor 870, and configured to allow a sensing through the transparent ring 810. According to some embodiments, a bottom portion of the shaft 840 is used as a pivot point for rotation during the epitaxial growth process.

In some embodiments, the sensor 890 is used to sense a temperature signal of a wafer 3000, which is on the susceptor 870, by infra-red radiation. In greater detail, the transparent ring 810 is between the susceptor 870 and the sensor 890, so that the infra-red radiation from the wafer 3000 may pass through the transparent ring 810 (indicated by the dashed line L3) and be detected by the sensor 890 as shown in FIG. 8.

In addition, the transparent ring 810 has a width W, which is defined by an inner surface 811 to an outer surface 812 of the transparent ring 810. More particularly, but not by way of limitation, each of the first pins 850 is disposed between each arm 820 and the outer surface 812 of the transparent ring 810, and connects each arm 820 and the transparent ring 810. Besides, each of the second pins 860 is disposed between the shaft 840 and the inner surface 811 of the transparent ring 810, and connects the shaft 840 and the transparent ring 810 in accordance with some embodiments.

In some embodiments, the upper lamp bank and the lower lamp bank of the heating sources 880 shown in FIG. 8 are separately disposed over and below the wafer supporting structure, and used for heating the wafer 3000 disposed on the susceptor 870. As a result, the top side of the wafer 3000 is heated by the radiant thermal transfer from the upper lamp bank of the heating sources 880. The backside of the wafer 3000 is heated by the conduction thermal transfer from the heated susceptor 870, which is heated by the radiant thermal transfer from the lower lamp bank of the heating sources 880.

The configuration of the heating source 880 and the sensor 890 is merely an example. One person skilled in the art will recognize many variations, alternatives, and modifications.

Furthermore, the susceptor 870 is employed to mechanically support the wafer 3000, and helps to protect the backside of the wafer 3000 so as to ensure uniform heating of the wafer 3000. In other embodiments, the wafer supporting structure of the device 800 does not include the susceptor 870, so that the wafer 3000 is disposed on the arms 820. In accordance with said embodiments, the backside of the wafer 3000 is directly heated by the radiant thermal transfer from the lower lamp bank of the heating sources 880.

In greater detail, the transparent ring 810 is horizontal to the susceptor 870 and the wafer 3000. In addition, the transparent ring 810 is a platform, which has a constant thickness H and a flat surface, so that the radiant thermal transfer from the lower lamp bank of the heating sources 880 through the transparent ring 810 may uniformly heat the backside of the wafer 3000. Further, the transparent ring 810 with the flat surface and the constant thickness may reduce focusing or scattering effect from the lower lamp bank of the heating sources 880 to the wafer 3000.

For instance, the sensor 660 is a pyrometer, which is used to receive the infra-red radiation (indicated by the dashed line L3) emitted from the wafer 3000 through a region from the inner surface 811 to the outer surface 812 of the transparent ring 810.

In some embodiments, a hole 830 is in a central region of the transparent ring 810 and surrounded by the inner surface 811 of the transparent ring 810. In accordance with said embodiments, since the hole 830 exists in the central region of the transparent ring 810, a horizontal area of the transparent ring 810 is smaller than a circular platform. As a result, the wafer supporting structure including the transparent ring 810 may prevent an epitaxial film, for example, a silicon film, deposited thereon during the epitaxial growth process because of the small horizontal area of the transparent ring 810, so that the infra-red radiation from the wafer 3000 may pass through the region between the inner surface 811 and the outer surface 812 of the transparent ring 810 (indicated by the dashed line L3) and be accurately detected by the sensor 890.

In some embodiments, since the transparent ring 810 has the flat surface and the constant thickness H, the transparent ring 810 may be easy to mass production. Other details in FIG. 8 may refer to the descriptions of the counterparts in FIGS. 4A through 4D, and hence are not repeated herein.

Figure 9:
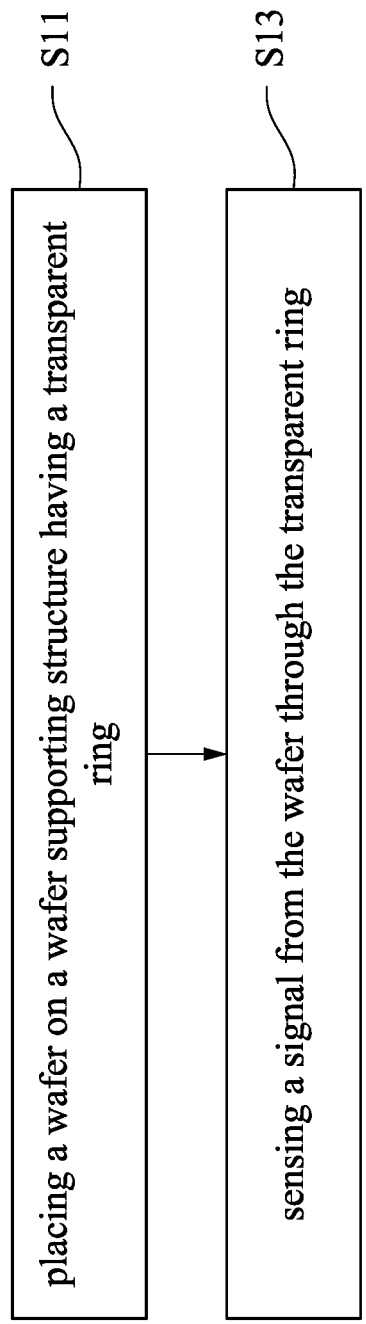
FIG. 9 is a flow chart illustrating a method for manufacturing semiconductor according to some embodiments.

Please refer to FIG. 9. FIG. 9 is a flow chart illustrating a method for manufacturing semiconductor according to some embodiments.

In some embodiments, the instant disclosure provides a method for manufacturing semiconductor. Referring to FIG. 9, the method includes placing a wafer on a wafer supporting structure having a transparent ring (S11), and sensing a signal from the wafer through the transparent ring (S13).

Referring to FIG. 9, the method begins at operation S11, placing a wafer on a wafer supporting structure having a transparent ring. In some embodiments, the wafer supporting structure may be one of the wafer supporting structures in FIGS. 1A through 5B. The details of the wafer supporting structure in FIGS. 1A through 5B may refer to the descriptions of the counterparts in FIGS. 1A through 5B, and hence are not repeated herein. In greater detail, the wafer may be placed on a susceptor or at least two arms of the wafer supporting structure, and rotated by the wafer supporting structure during the epitaxial growth process.

Still referring to FIG. 9, the method proceeds to operation S13, sensing a signal from the wafer through the transparent ring. In some embodiments, sensing the signal is sensing a temperature signal of the wafer.

More particularly, the signal may be, but not limit to, infra-red radiation. In some embodiments, sensing the signal is sensing the temperature signal by infra-red radiation from the wafer. The sensor shown in FIGS. 6 through 8 is disposed below the transparent ring and the susceptor.

In some embodiments, the transparent ring shown in FIGS. 6 through 8 is between the susceptor and the sensor. In said embodiments, the signal, for example, infra-red radiation, from the wafer may merely pass through a region between an inner surface and an outer surface of the transparent ring so as to be accurately detected by the sensor.

In some embodiments of the instant disclosure, the method for manufacturing semiconductor further includes heating the wafer. As shown in FIGS. 6 through 8, the heating source may be implemented by using two lamp banks, namely an upper lamp bank and a lower lamp bank, and the heating source disposed adjacent to the wafer supporting structure.

In some embodiments, the upper lamp bank and the lower lamp bank of the heating sources are separately disposed over and below the wafer supporting structure, and used for heating the wafer disposed on the wafer supporting structure. In greater detail, a transparent ring of the wafer supporting structure shown in FIGS. 1A through 8 is a platform, which has a constant thickness and a flat surface, so that the radiant thermal transfer from the lower lamp bank of the heating sources through the transparent ring may uniformly heat the backside of the wafer. Accordingly, the transparent ring with the flat surface and the constant thickness may reduce focusing or scattering effect from the lower lamp bank of the heating sources to the wafer.

In other embodiments of the instant disclosure, the method for manufacturing semiconductor further includes regulating the heating of the wafer. In other words, an output of the heating source shown in FIGS. 6 through 8 is adjusted after sensing the temperature signal of the wafer. As mentioned in the beginning, it is noteworthy that the wafer temperature controlling is important for fabricating a semiconductor structure, especially during an epitaxial growth process. The device shown in FIGS. 6 through 8, which may include the wafer supporting structure shown in FIGS. 1A through 5B, can accurately detect the temperature of the wafer by the sensor, so that a more accurate algorithm can be achieved. Therefore, a precise control of the wafer temperature can be performed during the semiconductor manufacturing process.

The embodiments of the instant disclosure discussed above have advantages over existing structures and methods. The device shown in FIGS. 6 through 8 of the instant disclosure includes the wafer supporting structure shown in FIGS. 1A through 5B, which can uniformly heat a wafer, and accurately detect and control a temperature of the wafer during semiconductor manufacturing, for example, the epitaxial growth process. Since the transparent ring of the wafer supporting structure is a platform with a constant thickness and a flat surface and horizontal to the wafer, the radiant thermal transfer from a lower lamp bank of heating sources of the device through the transparent ring may uniformly heat the wafer. Accordingly, it may reduce focusing or scattering effect from the lower lamp bank of the heating sources to the wafer.

Furthermore, a hole exists in the central region of the transparent ring, so that the transparent ring may prevent an epitaxial film deposited thereon during the epitaxial growth process because of the small horizontal area of the transparent ring. As a result, the signal, for example, infra-red radiation, from the wafer may merely pass through a region between an inner surface and an outer surface of the transparent ring without any interference so as to be accurately detected by the sensor. As the temperature of the wafer can be accurately detected, a more accurate algorithm can be achieved. Therefore, a precise control of the wafer temperature can be performed during the epitaxial growth process so as to reduce operation and process variations and improve the quality, performance and yield of epitaxially grown wafers.

Accordingly, use the device which includes the wafer supporting structure of the instant disclosure during the semiconductor manufacturing process, and the issue of the wafer temperature controlling is thereby improved.

In accordance with some embodiments of the instant disclosure, a wafer supporting structure in semiconductor manufacturing includes a transparent ring and at least two arms. The arms are connected to the transparent ring.

In accordance with other embodiments of the instant disclosure, a device for manufacturing semiconductor includes a wafer supporting structure, a heating source and a sensor. The wafer supporting structure has a transparent ring. The heating source is disposed adjacent to the wafer supporting structure. The sensor is disposed below the transparent ring of the wafer supporting structure and configured to allow a sensing through the transparent ring.

In accordance with yet other embodiments of the instant disclosure, a method for manufacturing semiconductor includes following steps. A wafer is placed on a wafer supporting structure having a transparent ring. A signal is sensed from the wafer through the transparent ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer supporting structure in semiconductor manufacturing, comprising:
   a transparent ring;
   at least two arms connected to the transparent ring; and
   a first pin disposed between at least one of the at least two arms and an outer surface of the transparent ring, and connecting the at least one of the at least two arms and the transparent ring.

2. The wafer supporting structure of claim 1, wherein the transparent ring is interposed into the at least two arms which are connected at a central point, and the transparent ring is concentric to the central point.

3. The wafer supporting structure of claim 2, further comprising:

a shaft connected to the at least two arms at the central point.

4. The wafer supporting structure of claim 1, wherein the transparent ring has a constant thickness defined by an upper surface and a lower surface of the transparent ring.

5. The wafer supporting structure of claim 1, wherein the transparent ring has a width defined by an inner surface and the outer surface of the transparent ring.

6. The wafer supporting structure of claim 5, further comprising:
a shaft connected to the inner surface of the transparent ring.

7. The wafer supporting structure of claim 6, further comprising:
a second pin disposed between the shaft and the inner surface of the transparent ring, and connecting the shaft and the transparent ring.

8. A device for manufacturing semiconductor, comprising:
a wafer supporting structure comprising:
a transparent ring; and
at least two arms connected to the transparent ring, wherein at least a portion of at least one of the at least two arms is disposed above the transparent ring;
a heating source disposed adjacent to the wafer supporting structure; and
a sensor disposed below the transparent ring of the wafer supporting structure and configured to allow a sensing through the transparent ring.

9. The device of claim 8, wherein the transparent ring has a constant thickness defined by an upper surface and a lower surface of the transparent ring.

10. The device of claim 8, wherein the transparent ring has a width defined by an inner surface and an outer surface of the transparent ring.

11. The device of claim 8, wherein the sensor is a temperature sensor.

12. The device of claim 8, further comprising a susceptor disposed over the at least two arms and the transparent ring.

13. The wafer supporting structure of claim 5, wherein a central region of the transparent ring is a hole surrounded by the inner surface of the transparent ring.

14. The wafer supporting structure of claim 1, further comprising a susceptor mounted on the at least two arms and disposed over the transparent ring.

15. The device of claim 8, wherein the transparent ring is a platform having a flat surface.

16. The device of claim 12, wherein the susceptor is horizontal to the transparent ring.

17. A wafer supporting structure in semiconductor manufacturing, comprising:
a transparent ring;
a susceptor disposed over the transparent ring, separated from the transparent ring, and configured to support a wafer; and
at least two arms connected to the transparent ring and the susceptor, wherein at least a portion of at least one of the at least two arms is disposed between the transparent ring and the susceptor.

18. The wafer supporting structure of claim 17, further comprising:
a shaft disposed below the transparent ring and connected to the transparent ring; and
a pin disposed between the shaft and the transparent ring, and connecting the shaft and the transparent ring.

19. The wafer supporting structure of claim 17, wherein at least one of the at least two arms comprises:
a first arm having a first portion and a second portion, wherein the first portion is in contact with an upper surface of the transparent ring, and the second portion is connected to a lower surface of the transparent ring.

20. The device of claim 8, further comprising a first pin disposed between at least one of the at least two arms and the transparent ring, and connecting the at least one of the at least two arms and the transparent ring.

* * * * *